(12) United States Patent  (10) Patent No.: US 7,499,288 B2
Tanaka et al.  (45) Date of Patent: Mar. 3, 2009

(54) SURFACE MOUNTING SEMICONDUCTOR DEVICE

(75) Inventors: Kozo Tanaka, Tokyo (JP); Shinichi Seki, Tokyo (JP)

(73) Assignee: Stanley Electric Co., Ltd., Tokyo (JP)

( * ) Notice: Subject to any disclaimer, the term of this patent is extended or adjusted under 35 U.S.C. 154(b) by 0 days.

(21) Appl. No.: 11/425,578

(22) Filed: Jun. 21, 2006

(65) Prior Publication Data
US 2007/0081313 A1   Apr. 12, 2007

(30) Foreign Application Priority Data
Jul. 29, 2005   (JP) .............................. 2005-221154

(51) Int. Cl.
*H05K 7/10* (2006.01)
(52) U.S. Cl. ..................................... 361/767; 361/760
(58) Field of Classification Search ................ 361/600, 361/679, 748–751, 760–795, 688, 690, 689, 361/803, 804; 362/551, 555; 174/50, 50.54, 174/520, 521, 526
See application file for complete search history.

(56) References Cited

U.S. PATENT DOCUMENTS

| | | | | |
|---|---|---|---|---|
| 4,853,763 A * | 8/1989 | DeGree et al. | ......... | 174/138 G |
| 5,343,360 A * | 8/1994 | Sanwo | ......... | 361/707 |
| 6,015,719 A * | 1/2000 | Kish et al. | ......... | 438/29 |
| 6,345,903 B1 * | 2/2002 | Koike et al. | ......... | 362/249 |
| 6,412,971 B1 * | 7/2002 | Wojnarowski et al. | ...... | 362/249 |
| 6,417,017 B1 * | 7/2002 | Ih | ......... | 438/22 |
| 6,562,643 B2 * | 5/2003 | Chen | ......... | 438/26 |
| 6,601,295 B2 * | 8/2003 | Maekawa | ......... | 29/841 |
| 6,803,607 B1 * | 10/2004 | Chan et al. | ......... | 257/98 |
| 2001/0030866 A1 * | 10/2001 | Hochstein | ......... | 362/294 |
| 2002/0145874 A1 * | 10/2002 | Kahl | ......... | 362/260 |
| 2004/0201995 A1 * | 10/2004 | Galli | ......... | 362/373 |

FOREIGN PATENT DOCUMENTS

JP   2002252373   9/2002

* cited by examiner

*Primary Examiner*—Dean A. Reichard
*Assistant Examiner*—Yuriy Semenenko
(74) *Attorney, Agent, or Firm*—Cermak Kenealy Vaidya & Nakajima LLP

(57) ABSTRACT

In accordance with one example of the disclosed subject matter, a semiconductor device can include the following features. A first lead frame can be provided that has one end configured to form a recess. An LED chip can be mounted on an inner bottom surface of the recess. A bonding wire has one end connected to an electrode on the LED chip. A second lead frame has one end connected to the other end of the bonding wire. The LED chip and the bonding wire can be sealed in a sealing resin. The first lead frame and the second lead frame can protrude from the sealing resin and can be bent around to the bottom of the sealing resin. A groove formed through the center of the bottom of the sealing resin at least partly exposes an outer circumferential surface and an outer bottom surface of the recess from the sealing resin and into the groove.

21 Claims, 10 Drawing Sheets

(a)

(b)

(c)

(a)

(b)

(a)

(b)

(c)

Conductor Pattern on Circuit Board (Solder Joint Surface)

Conductor Pattern on Circuit Board (Solder Joint Surface)

(d)

Conductor Pattern on Circuit Board (Solder Joint Surface)

Conductor Pattern on Circuit Board (Solder Joint Surface)

SURFACE MOUNTING SEMICONDUCTOR DEVICE

This application claims the priority benefit under 35 U.S.C. §119 of Japanese Patent Application No. 2005-221154 filed on Jul. 29, 2005, which is hereby incorporated in its entirety by reference.

BACKGROUND

1. Field

The disclosed subject matter of the present application relates to a surface mounting semiconductor device, and more particularly to a surface mounting semiconductor device that can be equipped with a semiconductor element such as an IC, a diode, a light-emitting diode (LED), a photodiode, a PIN diode, a phototransistor, and/or other similar semiconductor components.

2. Description of the Related Art

Surface mounting semiconductor devices with various structures have been previously proposed. One conventional art example is structured as shown in FIG. 12 and includes lead frames 50a, 50b, 50c that are separated and arranged at three locations. On the first lead frame 50a, a semiconductor element (such as an LED chip 51) is mounted, with a thermal conductive adhesive interposed therebetween. Electrodes provided at two locations on the upper side of the LED chip 51 are connected through bonding wires 52b and 52c to the second lead frame 50b and the third lead frame 50c, respectively. Thus, the upper electrodes on the LED chip 51 are electrically connected to the second lead frame 50b and the third lead frame 50c, respectively.

The LED chip 51, the bonding wires 52b, 52c, and parts of the lead frames 50a, 50b, 50c are sealed in a transparent resin 53. In this case, as for the second lead frame 50b and the third lead frame 50c, one end of each is sealed in the transparent resin 53 and the other end of each protrudes from the transparent resin 53 to an external location. As for the first lead frame 50a, a lowermost surface 54a protrudes from the transparent resin 53 to an external location. The second lead frame 50b and the third lead frame 50c have respective lowermost surfaces 54b, 54c defining portions protruding from the transparent resin 53, which are located almost on the same plane as the lowermost surface 54a of the first lead frame 50a.

The surface mounting LED device (hereinafter referred to as "LED device") thus structured may be mounted as follows. For example, conductor patterns 55a, 55b, 55c separately formed at three locations on a circuit board are bonded to the lowermost surfaces 54a, 54b, 54c of the lead frames of the LED device via solder 57 having electrical conduction and thermal conduction properties.

Thus, heat radiated from the LED chip 51 can be conducted through the first lead frame 50a and the solder 57 in the LED device to the conductive pattern 55a and the circuit board 56 and then released to the atmosphere. As a result, elevation of the temperature at the LED chip 51 can be prevented and the light emission efficiency (brightness) can be sustained. In addition, factor(s) promoting deterioration of the LED chip 51 can be reduced and a long lifetime (an improvement in reliability) can be achieved (see, for example, Japanese Patent Document No.: JP-A 2002-252373, the disclosure of which is hereby incorporated by reference, and an English translation of which is submitted on even date with this application via an Information Disclosure Statement).

When the above-structured LED device is mounted on the circuit board, the following malfunction may arise. As shown in FIG. 13, the second lead frame 50b and the third lead frame 50c protrude from the transparent resin 53 of the LED device and have solder joints with the conductor patterns 55b, 55c on the circuit board 56. These solder joints are different in terms of condition from the solder joint between the first lead frame 50a equipped with the LED chip 51 and the conductor pattern 55a. Therefore, the LED device may be mounted in such a manner that the optical axis X of the LED device tilts α° toward a reference line normal to the circuit board 56 (the LED device tilts α° toward the circuit board 56).

Malfunction(s) may be caused by the following factor(s). As for the solder interposed between a solder joint surface (outer, exposed surface) of the first lead frame 50a equipped with the LED chip 51 and a solder joint surface of the conductor pattern 55a, the wetness and spread (e.g., viscosity) of solder is suppressed. Accordingly, solder stays in the space between the solder joint surface of the lead frame 50a and the solder joint surface of the conductor pattern 55a, resulting in formation of a certain thickness of solder between both joint surfaces.

The respective solder joint surfaces of the second lead frame 50b and the third lead frame 50c and the respective solder joint surfaces of the conductor patterns 55b, 55c have joints therebetween. In the joints, the solder between both joint surfaces may partly shift to a particular side to form solder fillets 58 at the time of jointing. Therefore, the thickness of solder between both joint surfaces is made thinner than the thickness of printed solder by the extent of the solder shifted to the side. In this case, the respective solder joint surfaces of the second and third lead frames 50b, 50c and the respective solder joint surfaces of the conductor patterns 55b, 55c have a thickness of solder therebetween. This thickness of solder is made thinner than the certain thickness of solder between the solder joint surface of the lead frame 50a and the solder joint surface of the conductor pattern 55a.

Therefore, when the certain thickness of solder is formed between the solder joint surface of the lead frame 50a and the solder joint surface of the conductor pattern 55a, this certain thickness of solder exerts an influence. In this case, either the second lead frame 50b or the third lead frame 50c lifts and tilts the LED device toward the circuit board 56.

In particular, when the lowermost surface of the first lead frame 50a equipped with the LED chip 51 is located almost on the same plane as the lowermost surfaces of the second lead frame 50b and the third lead frame 50c which is arranged at both sides thereof, the tilt of the mounted LED device toward the circuit board 56 becomes more remarkable.

Therefore, the conditions of formation of the solder joints are not made uniform as described above, and accordingly the LED device is mounted in a poor state and made unstable, with poor reliability on the solder joint.

Originally, when part of the first lead frame 50a equipped with the LED chip 51 is externally exposed, an effect of thermal radiation can be expected. The lack of reliability on the solder joint due to the poor mounting of the LED device lowers the conduction of heat to the circuit board 56 and the conductor pattern 55a formed on the circuit board 56, and prevents sufficient thermal radiation.

Particularly, in an LED device of the type that requires a large current to drive the LED chip 51, a failure to achieve excellent thermal radiation results in a large influence on reducing the efficiency of light emission.

The reproducibility of the tilt of the mounted LED device toward the circuit board 56 is poor with regard to the tilted angle α, resulting in worsened optical characteristics such as variations in distribution characteristic of the LED light.

An interval between two adjacent lead frames of the lead frames 50a, 50b, 50c is relatively short. The lead frames 50a, 50b, 50c are bonded to the conductor patterns 55a, 55b, 55c through the solder joints, respectively. Accordingly, the solder joints may be brought into contact with each other to cause electrical malfunctions.

After the LED device is mounted on the circuit board 56, the state of the joints between the lead frames 50a, 50b, 50c and the conductor patterns 55a, 55b, 55c can not necessarily be identified by image-recognition or by visual inspection. Thus, it may be impossible to eliminate occurrences of failed products within the production processes.

SUMMARY

The presently disclosed subject matter has been made in consideration of the above and other problems and accordingly can result in a product that has the ability to provide a surface mounting semiconductor device having nice mounting properties with good mounting reproducibility, excellent resistance to different environments, good thermal radiation properties, optical properties and electrical properties, high reliability, and other advantages.

According to a first aspect of the disclosed subject matter, a surface mounting semiconductor device can include: at least one semiconductor element; a recess having an outer bottom surface composed of a metal to receive the semiconductor element mounted thereon; a bonding wire having one end connected to an electrode on the semiconductor element; at least one wiring conductor connected to the other end of the bonding wire; a sealing resin arranged to seal over the semiconductor element and the bonding wire; a molded member formed integrally with or separately from the sealing resin to support the wiring conductor and surround the recess; and a groove having a certain width and depth and formed in the bottom of the molded member, wherein the outer bottom surface of the recess is exposed from the molded member, and at least part of an outer circumferential surface of the recess is exposed from the molded member into the groove.

In a second aspect of the disclosed subject matter, a surface mounting semiconductor device can include: at least one semiconductor element; a first lead frame having a recess formed therein to receive the semiconductor element mounted thereon; a bonding wire having one end connected to an electrode on the semiconductor element; at least one second lead frame separated from the lead frame that receives the semiconductor element mounted thereon, and connected to the other end of the bonding wire; a sealing resin arranged to seal over the semiconductor element and the bonding wire; and a molded member formed integrally with or separately from the sealing resin to partly support the first lead frame and the second lead frame, wherein the bottom of the molded member of the semiconductor element includes a groove having a certain width and depth formed therein, and an outer bottom surface and an outer circumferential surface of the recess are at least partly exposed from the molded member into the groove.

According to yet another aspect of the disclosed subject matter, the first lead frame and the second lead frame can be configured to protrude from the side of the molded member and have respective lowermost surfaces which are arranged almost on the same plane and located almost on the same plane as the outer bottom surface of the recess, or beneath the outer bottom surface of the recess at a distance less than a thickness of solder printed on mounting.

In another aspect of the disclosed subject matter, the semiconductor element can include an LED chip, wherein the molded member is composed of a transparent resin and a reflective resin. The molded member arranged to cover the LED chip and the bonding wire can be composed of the transparent resin, and the molded member that is arranged to cover the outer circumferential surface of the recess can be composed of the reflective resin.

The surface mounting semiconductor device of the disclosed subject matter can include a lead frame, which has one end that includes a recess therein. A semiconductor element can be mounted on an inner bottom surface of the recess. A bonding wire has one end connected to an electrode on the semiconductor element. At least one other lead frame can be provided that is separate from the lead frame equipped with the semiconductor element. The other lead frame can include one end connected to the other end of the bonding wire. The semiconductor element and the bonding wire can be sealed, either totally or partially, in a sealing resin. The lead frame equipped with the semiconductor element and the at least one other lead frame separated from the lead frame equipped with the semiconductor element can be shaped such that they protrude externally from the sealing resin. A groove can be formed in the center of the bottom of the sealing resin to expose an outer circumferential surface and an outer bottom surface of the recess at least partly from the sealing resin and into the groove. The recess may be formed in various shapes such as a conical trapezoid, a cylinder, shapes provided with steps on sides thereof, or other similar shapes.

When the above-structured surface mounting semiconductor device is mounted on the conduction patterns formed on the circuit board, three-dimensional solder joints can be achieved with the following solder fillets. The solder fillets can be formed by the solder joint between the lead frame equipped with the semiconductor element and can protrude from the sealing resin and the conductor pattern. The solder fillets can also be formed by the solder joint between the at least one other lead frame separated from the lead frame equipped with the semiconductor element and the conductor pattern. In addition, the solder fillets can be formed by the solder joint between the outer circumferential surface and outer bottom surface of the recess exposed into the groove and the conductor pattern.

Therefore, the surface mounting semiconductor device can be mounted on the circuit board reliably and in a stable state. In addition, the conductor pattern on the circuit board located immediately beneath the semiconductor element can be connected electrically and/or thermally through a short path. As a result, it is possible to realize a surface mounting semiconductor device having nice mounting properties, including good mounting reproducibility, excellent resistance to different environments, good thermal radiation properties, optical properties and/or electrical properties, and/or high reliability.

BRIEF DESCRIPTION OF THE DRAWINGS

FIG. 1(A) is a plan view, FIG. 1(B) is a cross-sectional view taken along line A-A of FIG. 1(A), and FIG. 1(C) is a bottom view;

FIG. 5(A) is a plan view, FIG.

5(B) is a cross-sectional view taken along line A-A of FIG. 1(A), FIG. 5(C) is a bottom view, and FIG. 5(D) is a front view of another example of a surface mounting semiconductor device made in accordance with principles of the disclosed subject matter, FIG. 5(E) is a bottom view of the device of FIG. 5(D), and FIG. 5(F) is a cross-sectional view of the device of FIG. 5(D) mounted on a circuit board and cut off along a plane parallel to a groove formed in the bottom;

FIG. 6(A) is a plan view, FIG. 6(B) is a cross-sectional view taken along line A-A of FIG. 1(A), FIG. 6(C) is a bottom view, and FIG. 6(D) is an alternative bottom view showing another embodiment of the semiconductor device;

FIG. 7(A) is a plan view, FIG. 7(B) is a cross-sectional view taken along line A-A of FIG. 7(A), and FIG. 7(C) is a bottom view;

FIG. 8(A) is a plan view, FIG. 8(B) is a cross-sectional view taken along line A-A of FIG. 8(A), FIG. 8(C) is a bottom view, and FIG. 8(D) is a cross-sectional view of the device of FIG. 8(A) mounted on a circuit board and cut off along a plane parallel to a groove formed in the bottom;

DETAILED DESCRIPTION OF EXEMPLARY EMBODIMENTS

Figure 1:
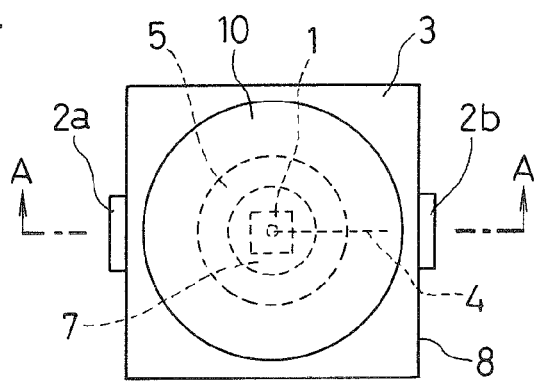
FIG. 1 shows an example of a surface mounting semiconductor device made in accordance with principles of the disclosed subject matter, where
Figure 1:
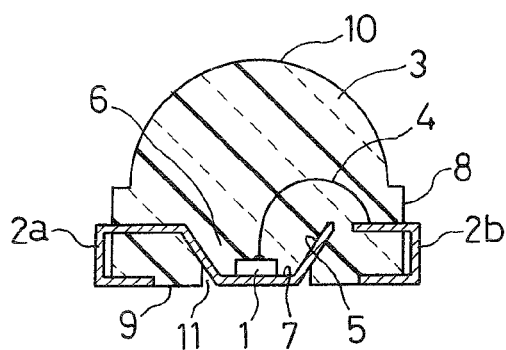
Figure 1:
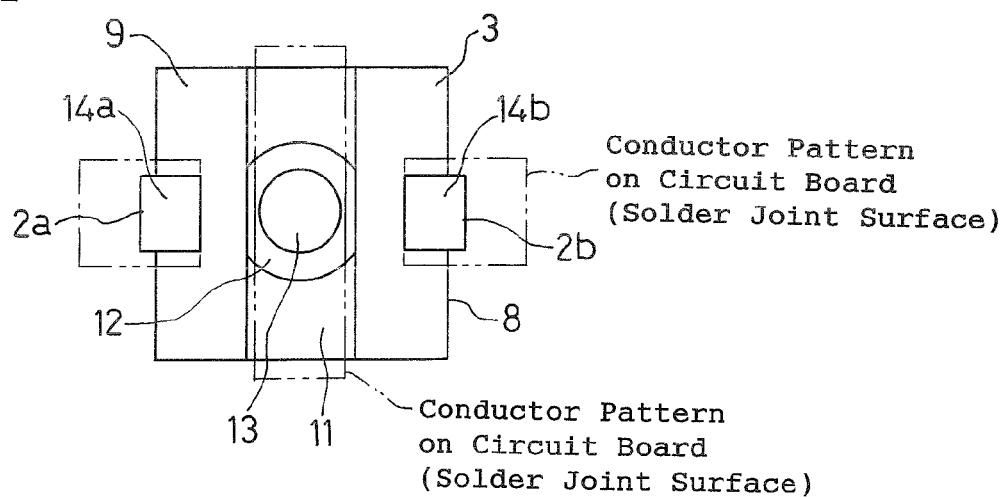

A surface mounting semiconductor device having nice mounting properties with good mounting reproducibility, excellent resistance to different environments, good thermal radiation properties, optical properties and electrical properties, high reliability, and/or other advantageous features is possible according to the disclosed subject matter herein. A semiconductor element can be mounted on an inner bottom surface of a recess formed in a lead frame and sealed in a resin. An outer bottom surface and an outer circumferential surface of the recess can be at least partly externally exposed from the sealing resin. The exposed portion(s) of the recess can be bonded to conductor patterns on a circuit board via a bonding agent having electrical conduction and/or thermal conduction. Such mounting can be adopted to achieve the above-noted features of the disclosed subject matter.

Exemplary embodiments of the disclosed subject matter will now be described in detail with reference to FIGS. 1-11 (denoting the same or similar parts with the same reference numerals). The embodiments described below are exemplary embodiments of the disclosed subject matter and are given a variety of technical features thereto. However, the scope of the disclosed subject matter is not limited to these embodiments.

Figure 2:
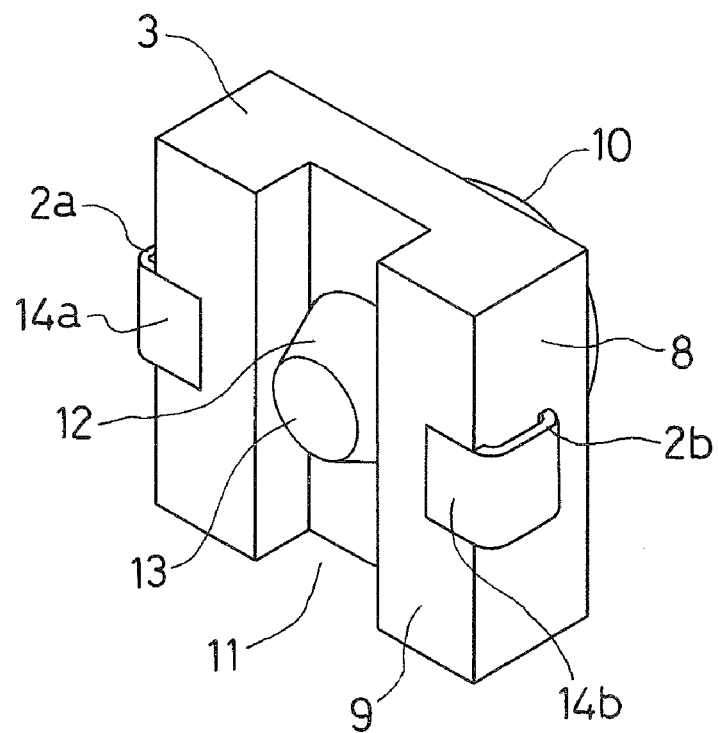
FIG. 2 is a perspective view of the surface mounting semiconductor device of FIG. 1, as seen from the bottom.

FIG. 1 shows an example of a surface mounting semiconductor device made in accordance with principles of the disclosed subject matter wherein FIG. 1(A) is a plan view, FIG. 1(B) is a cross-sectional view taken along line A-A of FIG. 1(A), and FIG. 1(C) is a bottom view. FIG. 2 is a perspective view of the semiconductor device of FIG. 1 as seen from the bottom. A semiconductor element mounted on the surface mounting semiconductor device according to the disclosed subject matter may include an IC, a diode, a light-emitting diode (LED), a photodiode, a PIN diode, a phototransistor, etc. In examples described below, though, an LED element (LED chip) is used, and the surface mounting semiconductor device is exemplified as a surface mounting LED device, which is referred to simply as an "LED device."

The LED device of the disclosed subject matter can include an LED chip 1, lead frames 2a, 2b, and a sealing resin 3.

The LED chip 1 serves as a light-emitting source for the LED device and can include a semiconductor element operative to emit light with wavelengths ranging from ultraviolet through visible light to infrared.

The lead frames 2a, 2b play an electrical role in supplying drive power to the LED chip 1, an optical role in improving the extraction efficiency of light from the LED device, and a thermal role in contributing to radiation of heat from the LED chip 1.

The sealing resin 3 protects the LED chip 1 from external environments such as humidity, dust and gases, and also protects a bonding wire 4 from mechanical stresses such as vibrations and impacts. The sealing resin 3 can form an interface with a light exit surface of the LED chip 1 and have a function of improving the emission efficiency of light emitted from the LED chip 1.

A structural description of the LED device is provided as follows. The first lead frame 2a can include one end with a recess 6 formed therein. The recess 6 can include at least an inner circumferential surface 5 serving as a reflecting surface. The LED chip 1 can be mounted on an inner bottom surface 7 of the recess 6 with an electrical conductive adhesive interposed therebetween. Thus, a lower electrode on the LED chip 1 can be electrically connected to the first lead frame 2a.

The second lead frame 2b can be connected to bonding wire 4. The bonding wire 4 can include one end connected to an upper electrode on the LED chip 1 and the other end connected to one end of the second lead frame 2b. Thus, the upper electrode on the LED chip 1 can be electrically connected to the second lead frame 2b.

The transparent sealing resin 3 can be provided in a manner such that the following structures are integrally sealed therein: the LED chip 1 and the recess 6 of the first lead frame 2a equipped with the LED chip 1 thereon; the bonding wire 4 and the end of the second lead frame 2b connected to the bonding wire 4.

The other ends of the paired separated lead frames 2a, 2b can protrude from opposite sides 8 of the transparent sealing resin 3, and be bent almost at right angles along the sides 8. Then, after extending along the sides 8, they can be bent again almost at right angles along the bottom 9.

Above the LED chip 1, a spherical or non-spherical convex lens 10 composed of the transparent sealing resin 3 can be formed. The lens 10 plays a role in collecting light in one direction to elevate the degree of brightness of the LED device when the LED light is emitted from the LED device.

As shown in FIG. 2, almost at the center in the bottom 9 of the transparent sealing resin 3, a groove 11 having a certain width and a certain depth from the bottom 9 can be formed in a direction almost normal to the direction of connecting the paired opposite lead frames 2a, 2b.

Part of an outer circumferential surface 12 and an outer bottom surface 13 of the recess 6 (equipped with the LED chip 1 on the inner bottom surface 7 thereof) can be exposed from the transparent sealing resin 3 into the groove 11.

Figure 3:
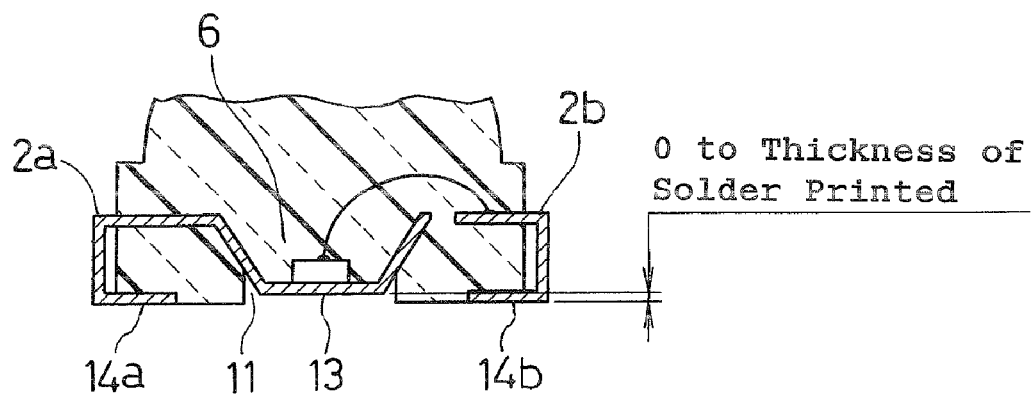
FIG. 3 is a partial cross-sectional view corresponding to FIG. 1B.

FIG. 3 shows a possible positional relation of the lowermost surfaces 14a, 14b of the lead frames 2a, 2b bent to the bottom 9 of the sealing resin 3 with respect to the outer bottom surface 13 of the recess 6 exposed in the groove 11. These surfaces can be configured such that they oppose conductor patterns on the circuit board as shown in FIG. 1C. These surfaces can also be bonded to the conductor patterns via solder. Therefore, the lowermost surface 14a of the first lead frame 2a and the lowermost surface 14b of the second lead frame 2b can be located on or almost on the same plane. They can also be located on or almost on the same plane as the outer bottom surface 13 of the recess 6, or beneath the outer bottom surface 13 of the recess 6 at a distance less than a thickness of the solder that is printed upon mounting of the device. In other words, the relation between the lowermost surfaces 14a, 14b of the lead frames 2a, 2b and the outer bottom surface 13 of the recess 6 can be described as follows. Namely, the outer bottom surface 13 of the recess 6 can be located at a higher position relative to the circuit board upon mounting than the lowermost surfaces 14a, 14b of the lead frames 2a, 2b within a range of difference of altitude from zero to the thickness of the printed solder.

Figure 4:
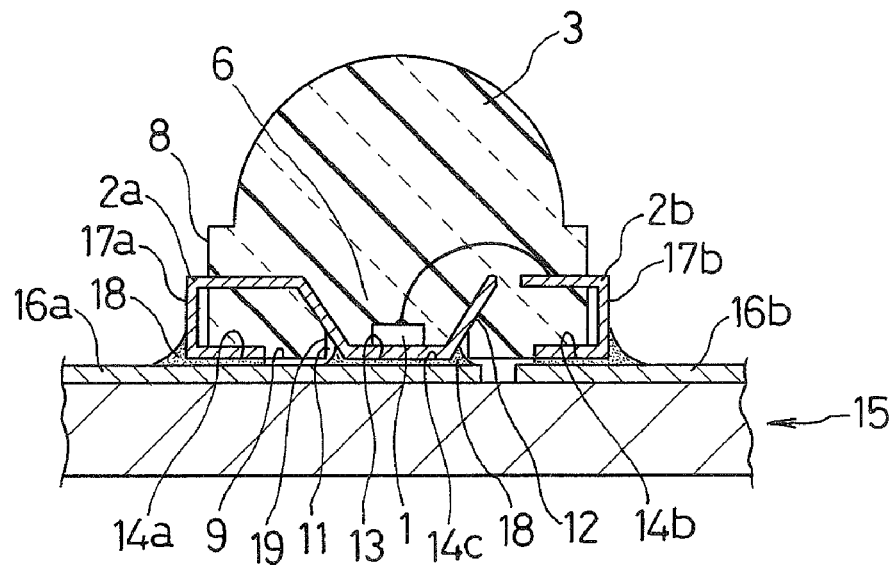
FIGS. 4(A and B) show cross-sectional views of the surface mounting semiconductor device of FIG. 1 mounted on a circuit board.
Figure 4:
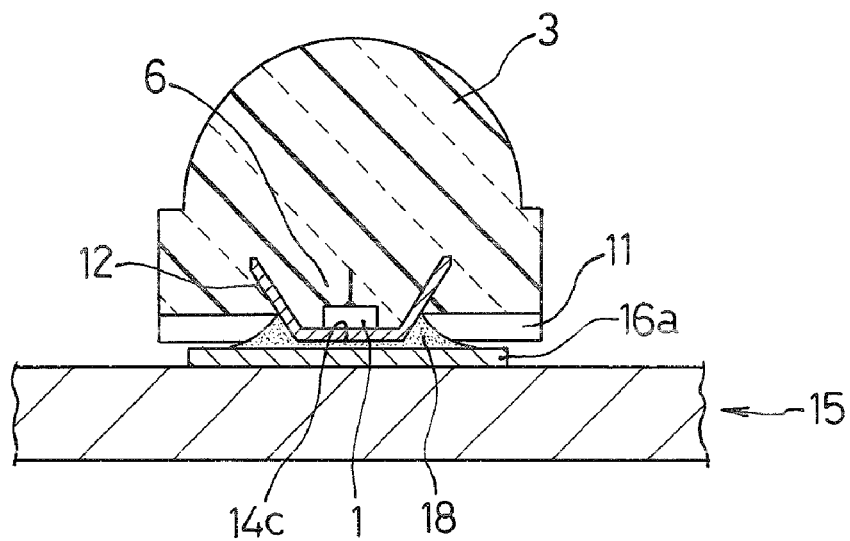

The following description is given with regard to the state of a solder joint when the above-configured LED device is mounted on the circuit board. FIG. 4 shows an LED device mounted on a circuit board. FIG. 4(A) is a cross-sectional view taken along a plane orthogonal to a groove formed in the bottom of the transparent sealing resin, and FIG. 4(B) is a cross-sectional view cut off along a plane parallel to the groove 11.

As shown in FIG. 4A, a pair of separated conductor patterns 16a, 16b can be formed on a circuit board 15. The first conductor pattern 16a can be soldered to the outer bottom surface 13 and part of the outer circumferential surface 12 of the recess 6 of the first lead frame 2a. The first conductor pattern can also be soldered to the lowermost surface 14a and an outer side 17a of the same first lead frame 2a that protrudes from the side 8 of the transparent sealing resin 3, extends along the side 8, and bends to the bottom 9 of the transparent sealing resin 3.

The second conductor pattern 16b can be soldered to the lowermost surface 14b and an outer side 17b of the second lead frame 2b that protrudes from the side 8 of the transparent sealing resin 3, extends along the side 8, and bends to the bottom 9 of the transparent sealing resin 3.

In this case, on the solder joint between the first conductor pattern 16a and the outer side 17a of the first lead frame 2a, the wetness and spread (e.g., viscosity) of the solder applied to respective surfaces allows the solder to form a solder fillet 18 to develop the solder joint three-dimensionally and in a wide configuration.

Also on the solder joint between the first conductor pattern 16a and the outer circumferential surface 12 of the recess 6 of the first lead frame 2a, the wetness and spread (e.g., viscosity) of the solder respectively applied thereto allows the solder to form a solder fillet 18. The wetness and spread of the solder at the first conductor pattern 16a, though, can be blocked at the side 19 of the groove 11. Accordingly, it is possible to prevent a short circuit from occurring when the solder (which bonds the first conductor pattern 16a to the joint surface 14c of the portion of the first lead frame 2a equipped with the LED chip 1) links with the adjacent solder (which bonds the second conductor pattern 16b to the lowermost surface 14b of the second lead frame 2b). In addition, the solder that bonds the joint surface 14c of the portion of the first lead frame 2a equipped with the LED chip 1 can be prevented from linking with the solder that bonds the first lead frame 2a, thereby achieving a stable joint. The solder that bonds the joint surface 14c of the portion of the first lead frame 2a equipped with the LED chip 1 may link with the solder that bonds the lowermost surface 14a of the first lead frame 2a. Even in such a case, no problem associated with a short circuit arises though the solder joint area becomes asymmetrical from left to right. As a result, a difference in surface tension between the left and right solder joint surfaces may cause a malfunction such as a displacement and possibly a tilt.

Further, on the solder joint between the second conductor pattern 16b and the outer side 17b of the second lead frame 2b, the wetness and spread of the solder applied thereto allows the solder to form a solder fillet 18 to develop the solder joint three-dimensionally and with a wide configuration. The solder fillet 18 can have almost the same dimension as that of the solder fillet 18 formed between the first conductor pattern 16a and the outer side 17a of the first lead frame 2a.

As shown in FIG. 4B, on the solder joint between the first conductor pattern 16a and the outer circumferential surface 12 of the recess 6 of the first lead frame 2a, the wetness and spread of the solder allows the solder to form a solder fillet 18. In this case, the wetness and spread allows the solder at the first conductor pattern 16a to extend along the groove 11. Accordingly, the solder fillet 18 has almost the same dimension and joint area as those of the solder fillets 18 formed between the first conductor pattern 16a and the outer side 17a of the same the first lead frame 2a, and between the second lead frame 2b and the outer side 17b of the second lead frame 2b.

Providing the groove 11 makes it possible to achieve a much stronger solder joint between the first conductor pattern 16a and the recess 6 of the first lead frame 2a.

Figure 5:
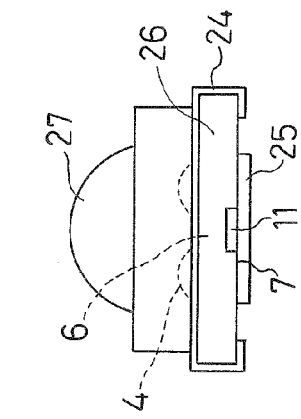
FIG. 5 shows another example of a surface mounting semiconductor device made in accordance with principles of the disclosed subject matter, where
Figure 5:
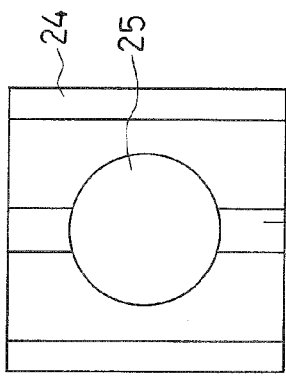
Figure 5:
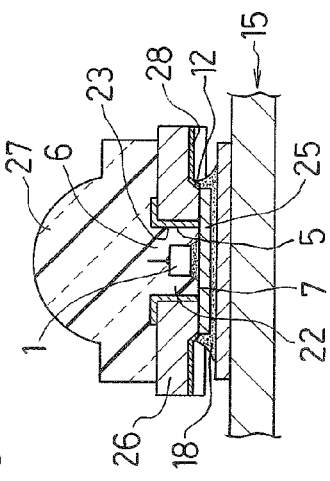
Figure 5:
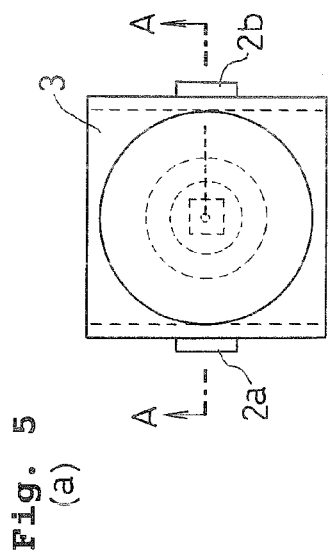
Figure 5:
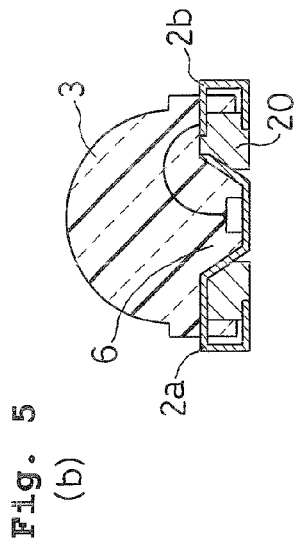
Figure 5:
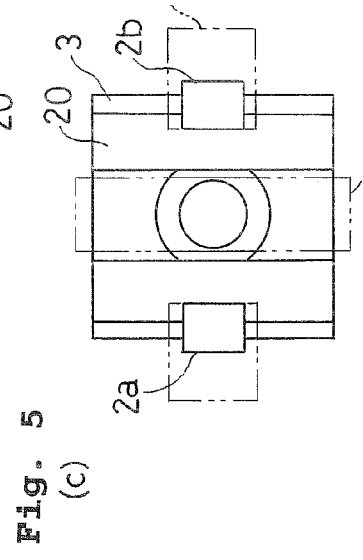

FIG. 5 shows another example of a semiconductor device with FIG. 5(A) being a plan view, FIG. 5(B) a cross-sectional view taken along line A-A of FIG. 5(A), and FIG. 5(C) being a bottom view.

The example of FIG. 5 is similar to that of FIG. 1 in structure, shape, conductor pattern, and state of solder joints on mounting. However, it can be different in terms of the structure of the molded member. In the example of FIG. 1, it is possible that only the transparent sealing resin is used to seal the LED chip, the bonding wire, and respective parts of the paired lead frames. The example of FIG. 5 can include two molded members: a reflective resin 20 used for sealing around the outer circumferential surface 12 of the recess 6; and a transparent sealing resin used for sealing the outside thereof.

Thus, the LED light received at the reflective resin 20 is reflected and effectively utilized as light that is externally emitted to improve the extraction efficiency of light. In this way, the molded member may be realized in various structures in accordance with the use and function of the particular application for the device. For example, a structure as shown in FIGS. 5D-F may be adopted. FIG. 5D is a front view, FIG. 5E is a bottom view, and FIG. 5F is a cross-sectional view cut off along a plane parallel to the groove 11.

An insulator with a bore 22 formed therethrough has a metal-plated reflecting portion 23, and a wiring conductor 24. The insulator may be selected from various materials such as a resin and a ceramic. A plate 25 of metal such as copper is provided at the opening in the bottom of the bore 22 and, on the metal plate 25, the LED chip 1 can be mounted. The inner circumferential surface 5 of the bore 22 defines the inner surface of the recess 6, and the metal plate 25 provided at the opening defines the inner bottom surface 7 of the recess 5. The molded member can include a first molded member 26 composed of the insulator that supports the wiring conductor 24, and a second molded member 27 composed of the resin that seals the LED chip 1, the bonding wire 4, and part of the wiring conductor 24. The groove 11 can be formed in the bottom of the first molded member 26 to prevent solder from spreading in places other than the direction of groove 11, thereby avoiding formation of a solder bridge between the bottom of the recess 6 and the separate wiring conductor 24. Formation of the groove 11 creates the outer circumferential surface 12 of the recess 6 and exposes the outer circumferential surface 12 of the recess 6 into the groove 11. In this case, application of metal plating 28 over the outer circumferential surface 12 of the recess 6 and the groove 11 improves the wetness of solder, forms the solder fillets 18, and achieves more stable joints.

Figure 6:
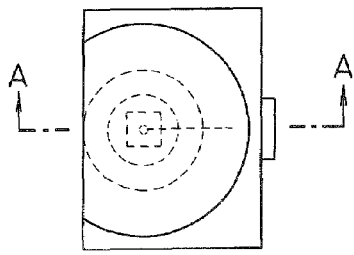
FIG. 6 shows yet another example of a surface mounting semiconductor device made in accordance with principles of the disclosed subject matter, where
Figure 6:
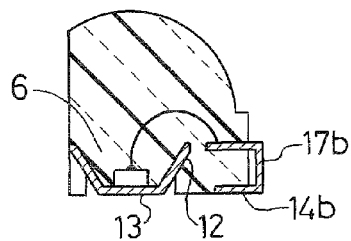
Figure 6:
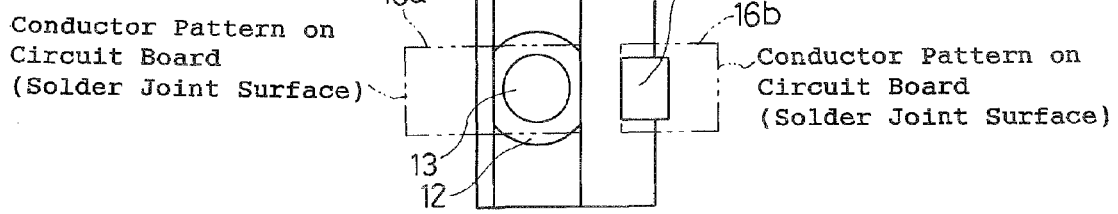
Figure 6:
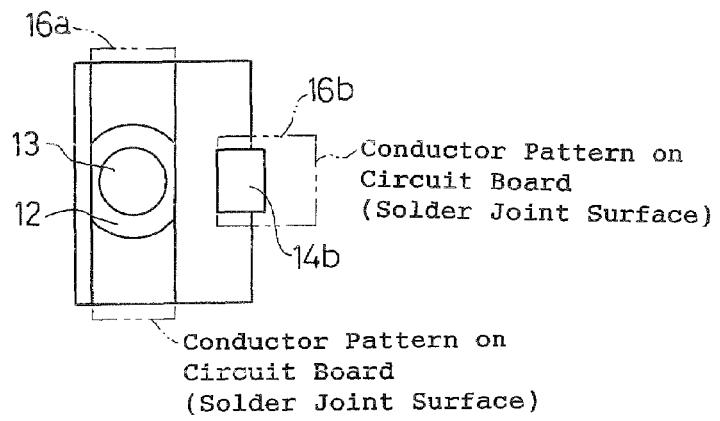

FIG. 6 shows another example of a semiconductor device made in accordance with principles of the disclosed subject matter, with FIG. 6(A) a plan view, FIG. 6(B) a cross-sectional view taken along line A-A of FIG. 6(A), and FIG. 6(C) and (D) bottom views.

The example shown in FIG. 6 is shaped in such a manner that part of the LED device of the example shown in FIG. 1 is cut off almost in parallel with the groove 11. Accordingly, solder joints are present at two locations between the lead frames of the LED device and the conductor patterns on the circuit board on mounting. One solder joint is present between the outer circumferential surface 12 and outer bottom surface 13 of the recess 6 and the first conductor pattern 16a for the first lead frame. Another is present between the lowermost surface 14b and outer side 17b and the second conductor pattern 16b for the second lead frame. In this case, the conductor patterns 16a, 16b serving as the solder joint surfaces may be shaped in various configurations, such as shown in FIG. 6C and D, while the state of solder joint on mounting of the LED device can be kept similar to the above-described examples shown in FIGS. 1 and 5.

The LED device thus shaped can be downsized with enhanced flexibility for mounting and for higher density of mounting. In production processes, downsizing can increase production of multiple faces, thereby improving the efficiency of production, and reducing the production cost per piece. In the mounting process, the number of the solder joints is small, thereby contributing to the improvement in the efficiency of mounting.

Figure 7:
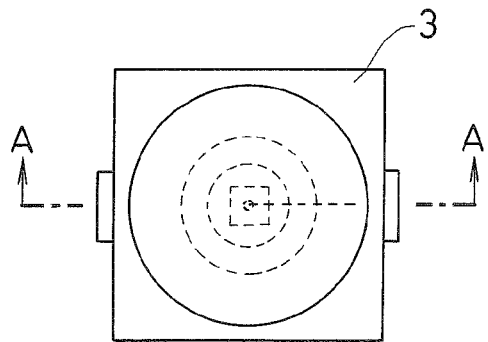
FIG. 7 shows another example of a surface mounting semiconductor device made in accordance with principles of the disclosed subject matter, where
Figure 7:
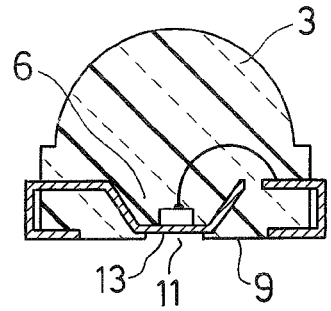
Figure 7:
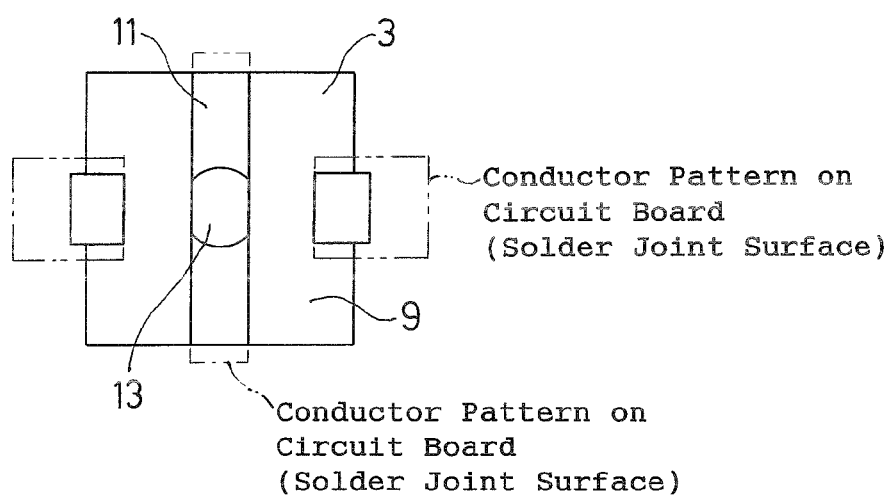

FIG. 7 shows yet another example of a semiconductor device made in accordance with principles of the disclosed subject matter, where FIG. 7(A) is a plan view, FIG. 7(B) is a cross-sectional view taken along line A-A of FIG. 7(A), and FIG. 7(C) is a bottom view. A narrower width and shallower depth of the groove 11 can move solder easily in the groove direction and achieve a more stable joint. An adjusted depth of the groove, together with the outer circumferential surface of the externally exposed recess can form a solder fillet, partly in the groove direction, between the first conductor pattern 16a and the outer side 17a of the first lead frame 2a.

In the example of FIG. 7, the width of the groove 11 formed in the bottom 9 of the sealing resin 3 is made narrower and the depth shallower than that shown in FIG. 1. Specifically, compared to the diameter of the outer bottom surface 13 of the recess 6, the width of the groove 11 is made smaller. A length from the bottom 9 of the sealing resin 3 to the outer bottom surface 13 of the recess 6 is determined to be substantially equal to the depth of the groove 11. Accordingly, part of the outer bottom surface 13 of the recess 6 is externally exposed.

Figure 8:
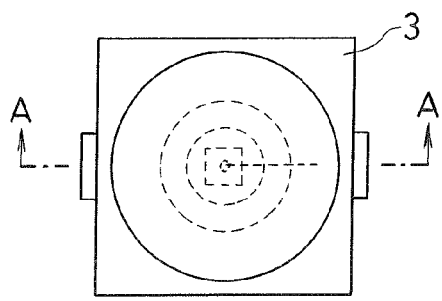
FIG. 8 shows another example of a surface mounting semiconductor device made in accordance with principles of the disclosed subject matter, where
Figure 8:
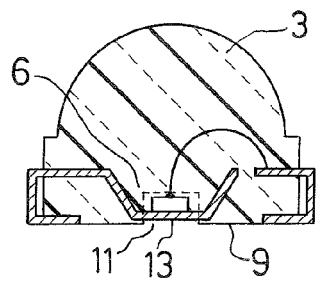
Figure 8:
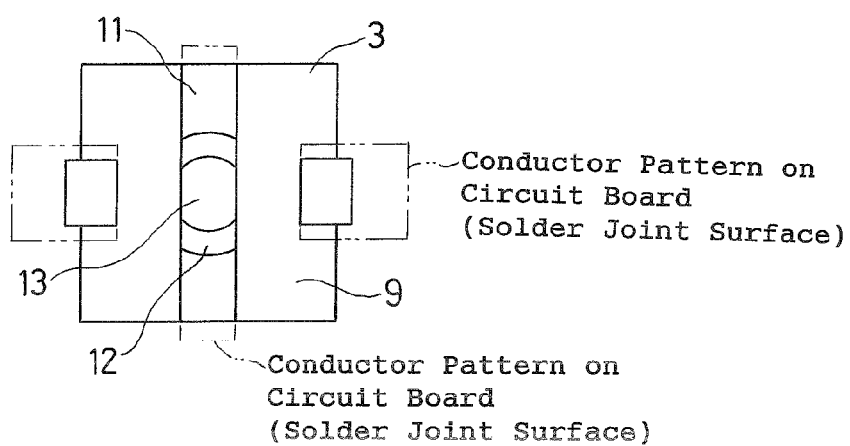
Figure 8:
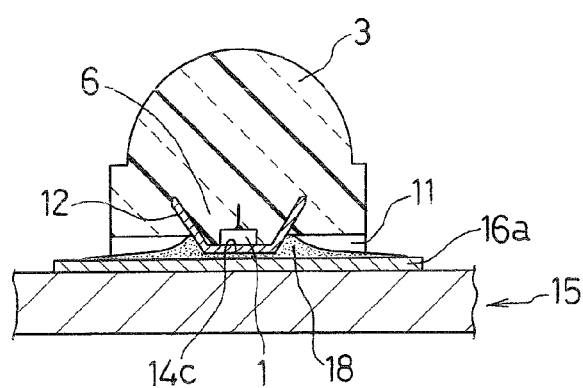

FIG. 8 shows another example of a semiconductor device made in accordance with principles of the disclosed subject matter, where FIG. 8(A) is a plan view, FIG. 8(B) a cross-sectional view taken along line A-A of FIG. 8(A), FIG. 8(C) a bottom view, and FIG. 8(D) a cross-sectional view cut off at a plane parallel to a groove formed in the bottom.

In the example shown in FIG. 8 the width of the groove 11 formed in the bottom 9 of the sealing resin 3 is made narrower than the diameter of the outer bottom surface 13 of the recess 6 shown in FIG. 1. Accordingly, part of the outer bottom surface 13 of the recess 6 and part of the outer circumferential surface 12 of the groove 11 are externally exposed from the transparent sealing resin 3. In addition, when the width of the recess is made narrower, the solder can be prevented from spreading in the width direction of the groove and caused to spread wider in the length direction of the groove. As shown in FIG. 8D, the fillet formed with the spread of solder in the length of the groove extends to the outside of the groove. Therefore, with regard to the outer circumferential surface and outer bottom surface of the recess, the state of the solder joint can be easily identified by image-recognition or visually upon mounting the LED device.

Figure 11:
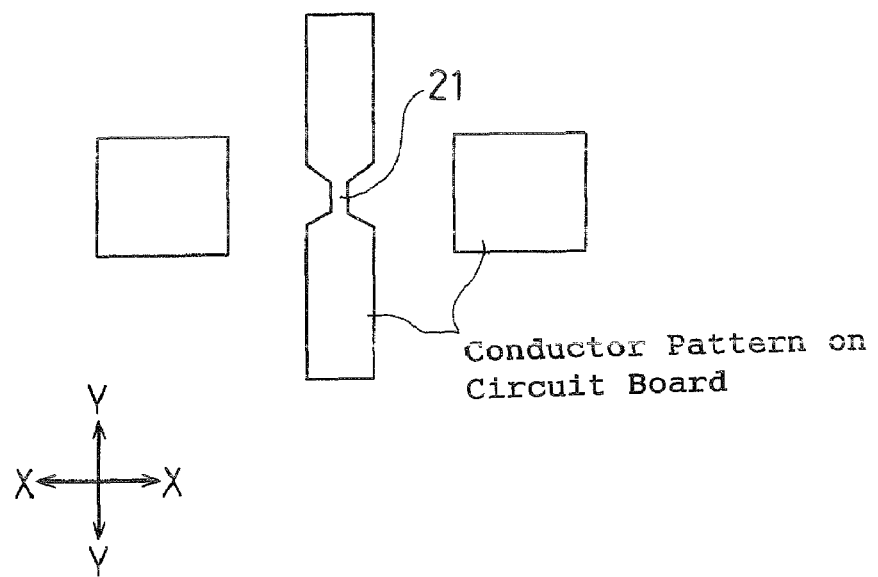
FIG. 11 is a plan view showing an example of conductor patterns formed on a circuit board.
Figure 12:
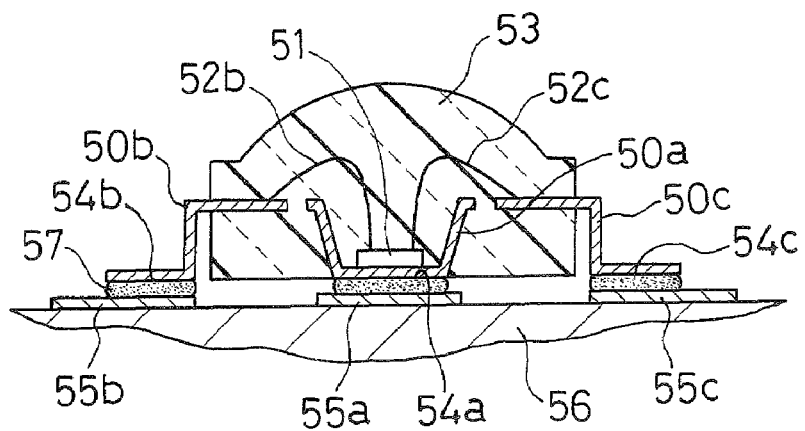
FIG. 12 is a cross-sectional view of a surface mounting semiconductor device of the conventional art mounted on a circuit board.
Figure 13:
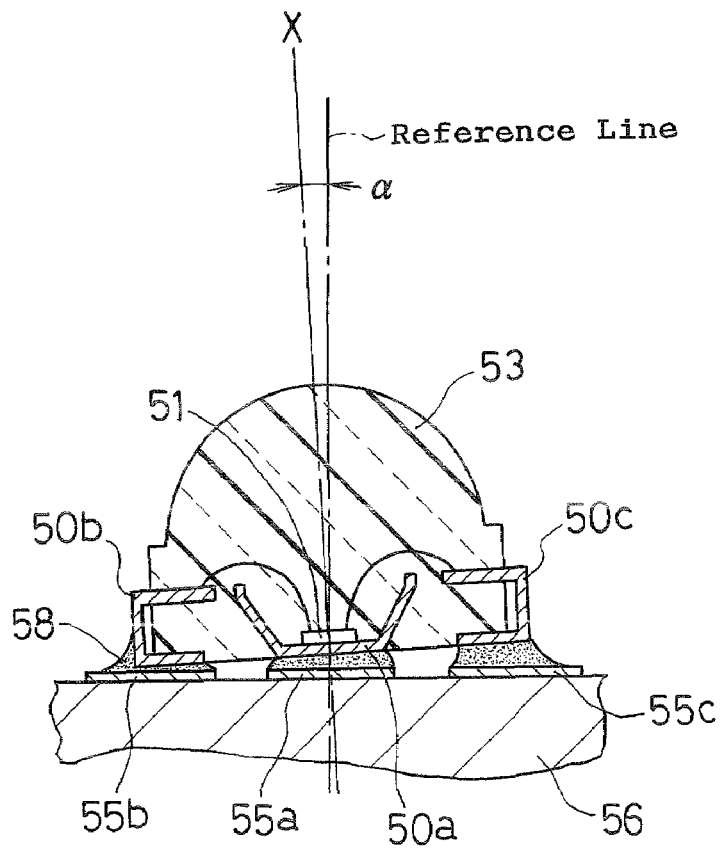
FIG. 13 is a cross-sectional view of another surface mounting semiconductor device of the conventional art mounted on a circuit board.

The LED device as shown in the above-described examples can also achieve stable joints when conductor patterns on the circuit board are formed (for example) as shown in FIG. 11. In FIG. 11 independent conductor patterns are formed at four locations (two locations thereof are linked through a narrow-width portion 21 and accordingly can be regarded as artificially independent). The conductor patterns corresponding to the groove are formed almost symmetrical about the position corresponding to the recess. The use of such conductor patterns performs alignment of the solder surface at the LED device to the conductor patterns in a plane (X, Y-directions) due to surface tension of solder on solution of solder, and improves the accuracy of the mounting position. Therefore, the use of this type of LED device makes it possible to obtain a stable LED illumination device that utilizes a self-alignment function at the solder joints formed by the groove.

In the above-described examples, the spherical or non-spherical lens composed of the transparent sealing resin is formed above the LED chip though it is not always required to include or provide a lens. Rather, the shape of the surface for emission of light may be determined appropriately based on a desired distribution characteristic of light.

Effects of the surface mounting semiconductor device of the disclosed subject matter will be described next based on the above examples. First, as for the example shown in FIG. 1, the first lead frame serving as one electrode on the LED device has one end with a reflective recess formed therein, of which at least the inner surface serves as a reflecting surface. The LED device serving as the light-emitting source is mounted on the inner bottom surface of the reflective recess. The outer bottom surface and outer circumferential surface of the reflective recess are externally exposed from the sealing resin. The other end of the first lead frame is also formed to protrude from the sealing resin and can be bent down to the bottom of the sealing resin. On the other hand, the second lead frame serving as the other electrode on the LED device has one end which is also formed to protrude from the sealing resin and be bent down to the bottom of the sealing resin.

When the LED device is mounted on the circuit board, there are solder joints with the conductor patterns on the circuit board at three portions. The three portions include the outer circumferential surface and outer bottom surface of the recess exposed from the sealing resin, the lowermost surface of the one end that protrudes from the sealing resin and is bent down to the bottom of the sealing resin (on the first lead frame), and the lowermost surface of one end that protrudes from the sealing resin and is bent down to the bottom of the sealing resin (on the second lead frame).

As a result, the performance of the solder joint with respect to the environmental resistance to vibrations and impacts can be improved, and high reliability can be ensured.

Similar to the lowermost surface of the lead frame soldered to the conductor pattern on the circuit board, three-dimensional solder fillets can also be formed in the solder joints associated with both surfaces of the outer circumferential surface and outer bottom surface of the recess. This is effective to suppress the tilt of the LED device toward the circuit board.

It is therefore possible to ensure/improve the reproducibility of the distribution characteristic of light from the LED device and achieve an LED light source that is excellent in optical properties.

The outer bottom surface opposite to the inner bottom surface of the recess equipped with the LED chip can be bonded to the conductor pattern on the circuit board via solder having electrical conduction and thermal conduction. Thus, heat radiated from the LED device can be conducted to the conductor pattern located immediately beneath, and released from the conductor pattern and the circuit board.

As a result, the nice property of thermal radiation suppresses the elevation of the temperature of the LED chip to block the reduction in the emission efficiency of light from the LED chip and ensure/improve a certain degree of brightness of the LED device. In addition, it suppresses the thermal deterioration of the LED chip and improves the lifetime and reliability.

When the LED device is mounted, the state of solder joints associated with the outer circumferential surface and outer bottom surface of the recess can be determined by image-recognition or via visual inspection. Accordingly, a soldering failure can be corrected to improve the reliability of the LED device mounting board. Further, adjustment of the width of the groove allows solder to form a fillet over the groove, facilitating easy image recognition and visual identification.

Figure 9:
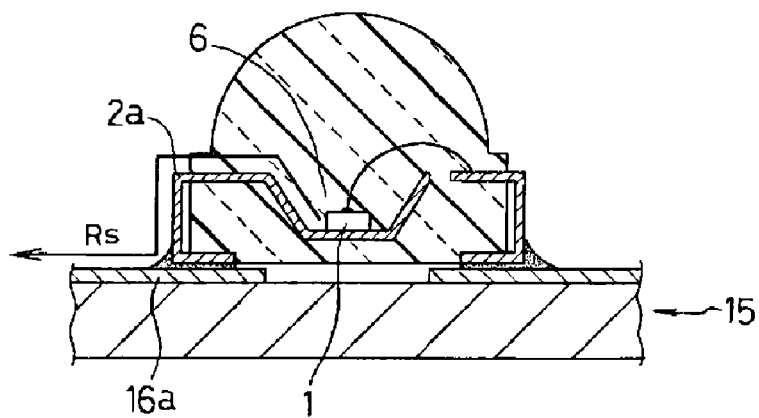
FIGS. 9(A and B) show cross-sectional views of surface mounting semiconductor devices mounted on a circuit board, with FIG. 9(A) showing a surface mounting semiconductor device of the conventional art, and FIG. 9(B) showing a surface mounting semiconductor device made in accordance with principles of the disclosed subject matter.
Figure 9:
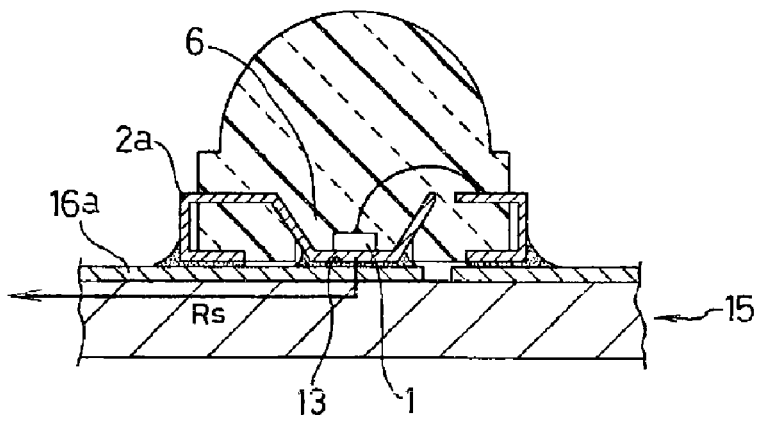

As shown in FIG. 9A, in general, a voltage applied to the lower electrode on the LED chip 1 is supplied from an external power source (not shown) via the first lead frame 2a and the first conductor pattern 16a on the circuit board 15. In the example of FIG. 9, voltage is supplied from an external power source via the first conductor pattern 16a located immediately beneath the lower electrode as shown in FIG. 9B.

Accordingly, compared to the LED device of the related art, the above-described example has the following features: a shorter conduction path length from the lower electrode on the LED chip 1 to the first conductor pattern 16a; a larger joint area of solder between the outer bottom surface 13 of the recess 6 of the first lead frame 2a and the first conductor pattern 16a on the circuit board 15; and, a smaller resistance Rs from the lower electrode on the LED chip 1 to the external power source.

Figure 10:
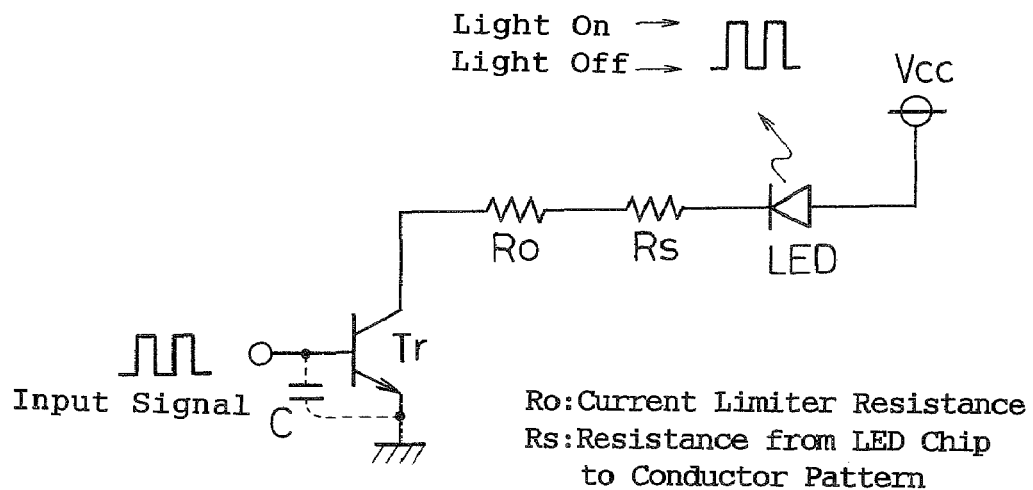
FIG. 10 is a circuit diagram showing an example of a method of driving a surface mounting semiconductor device made in accordance with principles of the disclosed subject matter.

As a result, when the LED device of this example is ON-OFF driven from a driver circuit as shown in FIG. 10, the value for CR, which is a determinant of the response time of the LED device (where C=an inner junction capacitance in Tr; R=Ro+Rs) can be reduced to achieve a much faster response.

A lowered Rs reduces power consumed in Rs and improves the utilization efficiency of a supply voltage. When the supply voltage is identical, a much larger current flows to elevate the brightness. The use of a constant current driver element (circuit) instead of Tr eliminates the use of Ro and accordingly further enhances the effect of reducing Rs. Such electrical effects can also be present in the other examples described in the presently disclosed subject matter.

As described above, the surface mounting semiconductor device of the disclosed subject matter can be configured to exert effects such as an adaptive effect of resistance to environments, an optical effect, a thermal effect, and an electrical effect.

In the example shown in FIG. 5, the reflective resin is used to seal around the outer circumferential surface of the recess with the LED chip mounted on the inner bottom surface similar to that of FIG. 1. The LED light received at the surface of the reflective resin is reflected and effectively utilized as light emitted externally from the LED device to improve the extraction efficiency of light. Therefore, in addition to the effect of the example shown in FIG. 1, the example of FIG. 5 can also have an excellent optical effect that can realize higher brightness.

The example shown in FIG. 6 is shaped to remove a part of the example shown in FIG. 1. Therefore, in addition to the above-described effects of the example shown in FIG. 1, the example shown in FIG. 6 makes it possible to downsize the LED device, develop the flexibility of mounting, and increase the density of mounting. In production processes, downsizing can increase production of multiple faces, thereby improving the efficiency of production, and reducing the production cost per piece. In the mounting process, the number of the solder joints is small, thereby contributing to the improvement in the efficiency of mounting.

In the example shown in FIG. 7, the groove of the example shown in FIG. 1 is made narrower, and part of the outer bottom surface of the recess is externally exposed. Therefore, the solder fillet can be formed smaller in the recess and can result in a reduction in effects described above with respect to the example of FIG. 1. However, it is possible to simplify the mold for molding the sealing resin and to facilitate a reduction in the production cost.

Finally, in the example shown in FIG. 8, the width of the groove as compared to that shown in the example of FIG. 1 is made narrower than the diameter of the outer bottom surface of the recess. When the width of the recess is made narrower, solder can be prevented from spreading in the width of the groove. Accordingly, the solder fillet spreads wider in the length of the groove and extends outside the groove. Thus, with regard to the outer circumferential surface and outer bottom surface of the recess, the state of solder joint can be easily determined by image-recognition or by visual inspection when the LED device is mounted.

As for production of the surface mounting semiconductor device of the disclosed subject matter, conventional technologies such as transfer molding and casting can be utilized. In addition, conventional lead frames can be utilized similarly to form the inner circumferential surface of the recess as a reflecting surface, thereby providing a function of reflecting the LED light.

In the examples according to the disclosed subject matter, the lead frames include two parts: the lead frame for use in mounting the LED chip thereon; and the lead frame separated from the lead frame equipped with the LED chip thereon. However, the disclosed subject matter is not limited to this configuration. The number of lead frames can be determined in consideration of the number of electrodes on the semiconductor element to be mounted, the electrode arrangement, or other functional or aesthetic desires.

In the examples according to the disclosed subject matter, the shape of the groove and the sectional shape of the groove are shown as a rectangle. However, the groove according to the disclosed subject matter is not limited to this configuration. Various shapes and sizes can be selected in consideration of the semiconductor element to be mounted, the shape and size of the groove, the conductor patterns on the circuit board, the thickness of solder printed, and other functional or aesthetic desires.

While there has been described what are at present considered to be exemplary embodiments of the presently disclosed subject matter, it will be understood that various modifications may be made thereto, and it is intended that the appended claims cover all such modifications as fall within the true spirit and scope of the invention. All conventional art references described above are herein incorporated in their entirety by reference.

What is claimed is:

1. A surface mounting semiconductor device, comprising:
   at least one semiconductor element having at least one electrode;
   a recess having an outer bottom surface and an outer circumferential surface, the recess being composed of a metal and configured to receive the semiconductor element adjacent thereto;
   a bonding wire having one end connected to the at least one electrode on the semiconductor element;
   at least one wiring conductor connected to the other end of the bonding wire;
   a sealing resin arranged to seal over the semiconductor element and the bonding wire;
   a molded member formed one of integrally with the sealing resin and separately from the sealing resin, to support the wiring conductor and the recess, the molded member including a bottom surface; and
   a groove having a certain width and depth and formed in the bottom surface of the molded member,
   wherein the outer bottom surface of the recess is exposed from the molded member, and at least part of the outer circumferential surface of the recess is exposed from the molded member into the groove, and wherein the semiconductor element is mounted on the recess.

2. The surface mounting semiconductor device according to claim 1, wherein the semiconductor element includes an LED chip, and the molded member is composed of a transparent resin and a reflective resin, wherein a portion of the molded member is arranged to cover the LED chip and the bonding wire and is composed of the transparent resin, and another portion of the molded member is arranged to cover the outer circumferential surface of the recess and is composed of the reflective resin.

3. The surface mounting semiconductor device according to claim 1, wherein the molded member surrounds the recess.

4. The surface mounting semiconductor device according to claim 1, wherein the groove extends continuously between and through a first side and an opposed second side of the sealing resin.

5. A surface mounting semiconductor device, comprising:
   at least one semiconductor element having at least one electrode;
   a first lead frame having a recess portion formed therein to receive the semiconductor element adjacent thereto, the recess portion having an outer bottom surface and an outer circumferential surface;
   a bonding wire having one end connected to the at least one electrode on the semiconductor element;
   at least one second lead frame separated from the lead frame that receives the semiconductor element, the second lead frame being connected to the other end of the bonding wire;
   a sealing resin arranged to seal over the semiconductor element and the bonding wire; and
   a molded member formed one of integrally with the sealing resin and separately from the sealing resin to at least partly support the first lead frame and the second lead frame, the molded member including a bottom surface,
   wherein the bottom surface of the molded member includes a groove having a certain width and depth formed therein, and the outer bottom surface and the outer circumferential surface of the recess portion are at least partly exposed from the molded member into the groove.

6. The surface mounting semiconductor device according to claim 5, further comprising:
   a solder having a certain thickness and located adjacent the first lead frame and second lead frame to mount the first lead frame and second lead frame to a board, wherein the first lead frame and the second lead frame protrude from a side of the molded member and have respective lowermost surfaces which are arranged substantially in the same plane, and the outer bottom surface of the recess is located at a higher position relative to the board when mounted on the board than the lowermost surfaces of the lead frames within a range of difference of altitude with respect to the board from zero to the thickness of the solder.

7. The surface mounting semiconductor device according to claim 5, wherein the semiconductor element includes an LED chip, and the molded member is composed of a transparent resin and a reflective resin, wherein a portion of the molded member is arranged to cover the LED chip and the bonding wire and is composed of the transparent resin, and another portion of the molded member is arranged to cover the outer circumferential surface of the recess portion and is composed of the reflective resin.

8. The surface mounting semiconductor device according to claim 6, wherein the semiconductor element includes an LED chip, and the molded member is composed of a transparent resin and a reflective resin, wherein a portion of the molded member is arranged to cover the LED chip and the bonding wire and is composed of the transparent resin, and another portion of the molded member is arranged to cover the outer circumferential surface of the recess portion and is composed of the reflective resin.

9. The surface mounting semiconductor device according to claim 5, wherein the semiconductor element is mounted on the first lead frame.

10. The surface mounting semiconductor device according to claim 5, wherein the groove extends continuously between and through a first side and an opposed second side of the sealing resin.

11. The surface mounting semiconductor device according to claim 5, wherein the first lead frame and second lead frame are opposed to each and extend away from each other along a first direction substantially normal to an optical axis of the semiconductor device, and the groove is formed in a direction substantially perpendicular to the first direction.

12. A surface mounting semiconductor device, comprising:
   at least one semiconductor element having at least one electrode;

a recess having an outer bottom surface and an outer angled surface that forms an angle greater than zero with respect to the outer bottom surface, the recess including an inner bottom surface located adjacent the at least one semiconductor element;

a bonding wire having one end connected to the at least one electrode of the semiconductor element and a second end opposite the one end;

at least one wiring conductor connected to the second end of the bonding wire;

a sealing resin located adjacent the semiconductor element and the bonding wire; and a molded member portion including a bottom surface that has a groove with a certain width and depth, wherein the outer bottom surface of the recess is exposed from the molded member portion, and at least part of the outer angled surface of the recess is exposed from the molded member portion, and wherein the semiconductor element is mounted on the recess.

13. The surface mounting semiconductor device according to claim 12, further comprising:

a first lead frame including the recess;

a second lead frame located adjacent the first lead frame;

a solder having a certain thickness and located adjacent the first lead frame and second lead frame to mount the first lead frame and second lead frame to a board, wherein the first lead frame and the second lead frame protrude from a side of the molded member portion and have respective lowermost surfaces which are arranged substantially in the same plane, and the outer bottom surface of the recess is located at a higher position relative to the board when mounted on the board than the lowermost surfaces of the lead frames within a range of difference of altitude with respect to the board from zero to the thickness of the solder.

14. The surface mounting semiconductor device according to claim 12, wherein the semiconductor element includes an LED chip, and the molded member portion is composed of a transparent resin and a reflective resin, wherein a first portion of the molded member portion is arranged to cover the LED chip and the bonding wire and is composed of the transparent resin, and a second portion of the molded member portion is arranged to cover the outer angled surface of the recess and is composed of the reflective resin.

15. The surface mounting semiconductor device according to claim 13, wherein the semiconductor element includes an LED chip, and the molded member portion is composed of a transparent resin and a reflective resin, wherein a first portion of the molded member portion is arranged to cover the LED chip and the bonding wire and is composed of the transparent resin, and a second portion of the molded member portion is arranged to cover the outer angled surface of the recess and is composed of the reflective resin.

16. The surface mounting semiconductor device according to claim 12, wherein the molded member portion surrounds the recess.

17. The surface mounting semiconductor device according to claim 12, wherein the molded member portion and the sealing member are integrally formed.

18. The surface mounting semiconductor device according to claim 12, wherein the recess forms a cup shaped portion and the outer angled surface forms an outer circumferential surface that defines the cup shaped portion.

19. The surface mounting semiconductor device according to claim 12, wherein the outer bottom surface of the recess is exposed from the groove.

20. The surface mounting semiconductor device according to claim 12, wherein the groove extends continuously between and through a first side and an opposed second side of the sealing resin.

21. A surface mounting semiconductor device, comprising:

at least one semiconductor element having at least one electrode;

a recess having an outer bottom surface and an outer angled surface that forms an angle greater than zero with respect to the outer bottom surface, the recess including an inner bottom surface located adjacent the at least one semiconductor element;

a bonding wire having one end connected to the at least one electrode of the semiconductor element and a second end opposite the one end;

at least one wiring conductor connected to the second end of the bonding wire;

a sealing resin located adjacent the semiconductor element and the bonding wire;

a molded member portion including a bottom surface that has a groove with a certain width and depth, wherein the outer bottom surface of the recess is exposed from the molded member portion, and at least part of the outer angled surface of the recess is exposed from the molded member portion; and a solder portion located within the groove of the molded member portion, the solder portion formed within the groove and having a shape extending the entire width of the groove and along at least a portion of a length of the groove.

* * * * *